United States Patent
Lee et al.

(10) Patent No.: US 9,328,407 B2
(45) Date of Patent: May 3, 2016

(54) CLAMP

(71) Applicants: Sang-Yun Lee, Yongin (KR); Sung-Woo Jung, Yongin (KR)

(72) Inventors: Sang-Yun Lee, Yongin (KR); Sung-Woo Jung, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 219 days.

(21) Appl. No.: 13/900,751

(22) Filed: May 23, 2013

(65) Prior Publication Data

US 2014/0158045 A1   Jun. 12, 2014

(30) Foreign Application Priority Data

Jul. 9, 2012   (KR) .......................... 10-2012-0074638

(51) Int. Cl.
| | | |
|---|---|---|
| B05C 17/08 | (2006.01) | |
| C23C 14/04 | (2006.01) | |
| B05C 21/00 | (2006.01) | |
| C23C 14/12 | (2006.01) | |
| H01L 51/00 | (2006.01) | |

(52) U.S. Cl.
CPC ............... *C23C 14/042* (2013.01); *B05C 17/08* (2013.01); *B05C 21/005* (2013.01); *C23C 14/12* (2013.01); *H01L 51/0011* (2013.01)

(58) Field of Classification Search
None
See application file for complete search history.

(56) References Cited

U.S. PATENT DOCUMENTS 4,325,323 A * 4/1982 Rioux ............................ 118/504
5,534,969 A * 7/1996 Miyake ........................... 355/53

FOREIGN PATENT DOCUMENTS

| JP | 2006-233258 | 9/2006 |
|---|---|---|
| KR | 10-2006-0102089 A | 9/2006 |
| KR | 10-2008-0061496 A | 7/2008 |
| KR | 10-2011-0046782 A | 5/2011 |
| KR | 10-2011-0054172 A | 5/2011 |

* cited by examiner

*Primary Examiner* — Dah-Wei D Yuan
*Assistant Examiner* — Jethro M Pence
(74) *Attorney, Agent, or Firm* — Lee & Morse, P.C.

(57) ABSTRACT

A clamp configured to clamp an end of a unit mask supported while a tensile force is applied to the unit mask includes a clamp main body, and a rotation contact portion rotatably supported by the clamp main body and directly contacting the end of the unit mask.

10 Claims, 8 Drawing Sheets

First direction (a)　　　　　　　　　　　(b)

First direction

CLAMP

CROSS-REFERENCE TO RELATED APPLICATION

This application claims priority under 35 U.S.C. §119 to Korean Patent Application No. 10-2012-0074638 filed in the Korean Intellectual Property Office on Jul. 9, 2012, the entire contents of which are incorporated herein by reference.

BACKGROUND

1. Field

The described technology relates generally to a clamp. More particularly, the described technology relates generally to a clamp applying a tension to a unit mask used in deposition of an organic emission layer.

2. Description of the Related Art

As a display device which displays an image, an organic light emitting diode (OLED) display has come into the spotlight in recent years.

In order to manufacture the OLED display, an electrode having specific patterns, an organic emission layer, etc. should be formed. The method for forming the electrode and the organic emission layer, etc. can be applied to a deposition method using a mask assembly.

More specifically, the OLED display includes pixels that are a basic unit displaying images on a substrate and arrayed in a matrix form and an organic light emitting diode that has an anode (a first electrode) and a cathode (a second electrode) sequentially formed, putting organic emission layers each emitting light such as red, green, and blue, etc., for each pixel therebetween.

SUMMARY

Embodiments are directed to a clamp that clamps an end of a unit mask that is supported while a tensile force is applied to the unit mask, the clamp including a clamp main body, and a rotation contact portion rotatably supported by the clamp main body and directly contacting the end of the unit mask.

One of the clamp main body and the rotation contact portion may include a concaved second portion and the other of the clamp main body and the rotation contact portion may include a rotation shaft inserted to the concaved second portion.

The clamp may further include bearings provided between the concaved second portion and the rotation shaft.

An elastic restoring force may be generated between the rotation contact portion and the clamp main body.

The clamp may further include a restoring spring connecting the rotation contact portion and the clamp main body and generating the elastic restoring force.

The clamp may further include a stopper that is provided between the rotation contact portion and the clamp main body and that limits rotation of the rotation contact portion, the stopper being movable into the clamp main body from between the rotation contact portion and the clamp main body when the rotation contact portion contacts the end of the unit mask.

The rotation contact portion may include a first sub-rotation contact portion contacting a bottom side of the end of the unit mask, a second sub-rotation contact portion contacting a front side of the end of the unit mask. The clamp main body may include a pair of first tongs disposed in the bottom side of the end of the unit mask, the first tongs including a concaved first groove where the first sub-rotation contact portion is located, and a pair of second tongs disposed in the front side of the end of the unit mask so as to be rotatable in a direction of the first tongs, the second tongs including a concaved second groove where the second sub-rotation contact portion is located.

The clamp may further include a first stopper disposed between the first sub-rotation contact portion and the first tongs to limit rotation of the first sub-rotation contact portion, the first stopper being movable into the first tongs from between the first sub-rotation contact portion and the first tongs when the first sub-rotation contact portion contacts the end of the unit mask, and a second stopper disposed between the second sub-rotation contact portion and the second tongs to limit rotation of the second sub-rotation contact portion, the second stopper being movable into the second tongs from between the second sub-rotation contact portion and the second tongs when the second sub-rotation contact contacts the end of the unit mask.

The first tongs may further include a first protruded side disposed on an imaginary line that aligns with a first contact side of the first sub-rotation contact portion that is in contact with the end of the unit mask. The second tongs may further include a second protruded side disposed on an imaginary line that aligns with a second contact side of the second sub-rotation contact portion that is in contact with the end of the unit mask. The first stopper may include a first stopper main body extended in a bent manner into the first tongs from between the first sub-rotation contact portion and the first tongs, the first stopper main body penetrating the first protruded side, and a first spring located in the first tongs and generating an elastic restoring force between the first stopper main body and the first tongs. The second stopper may include a second stopper main body extended in a bent manner into the second tongs from between the second sub-rotation contact portion and the second tongs and penetrating the second protruded side, and a second spring disposed in the second tongs and generating an elastic restoring force between the second stopper main body and the second tongs.

The first stopper may include a third main body extended into the first tongs from between the first sub-rotation contact portion and the first tongs and then protruded in a bent manner to the outside of the first tongs, and a third spring disposed in the first tongs and generating an elastic restoring force between the third stopper main body and the first tongs. The second stopper may include a fourth stopper main body extended into the second tongs from between the second sub-rotation contact portion and the second tongs and then protruded in a bent manner to the outside of the second tongs, and being overlapped with the third stopper main body, and a fourth spring disposed in the second tongs and generating an elastic restoring force between the fourth stopper main body and the second tongs. The first tongs may further include a protrusion protruded in a direction of the second tongs. The second tongs may further include a weight being liftable by the protrusion, a lever shaft extended from the weight and supported by the second tongs, and a lever bar including a hook extended to the fourth stopper from the lever shaft.

DETAILED DESCRIPTION

Figure 1:
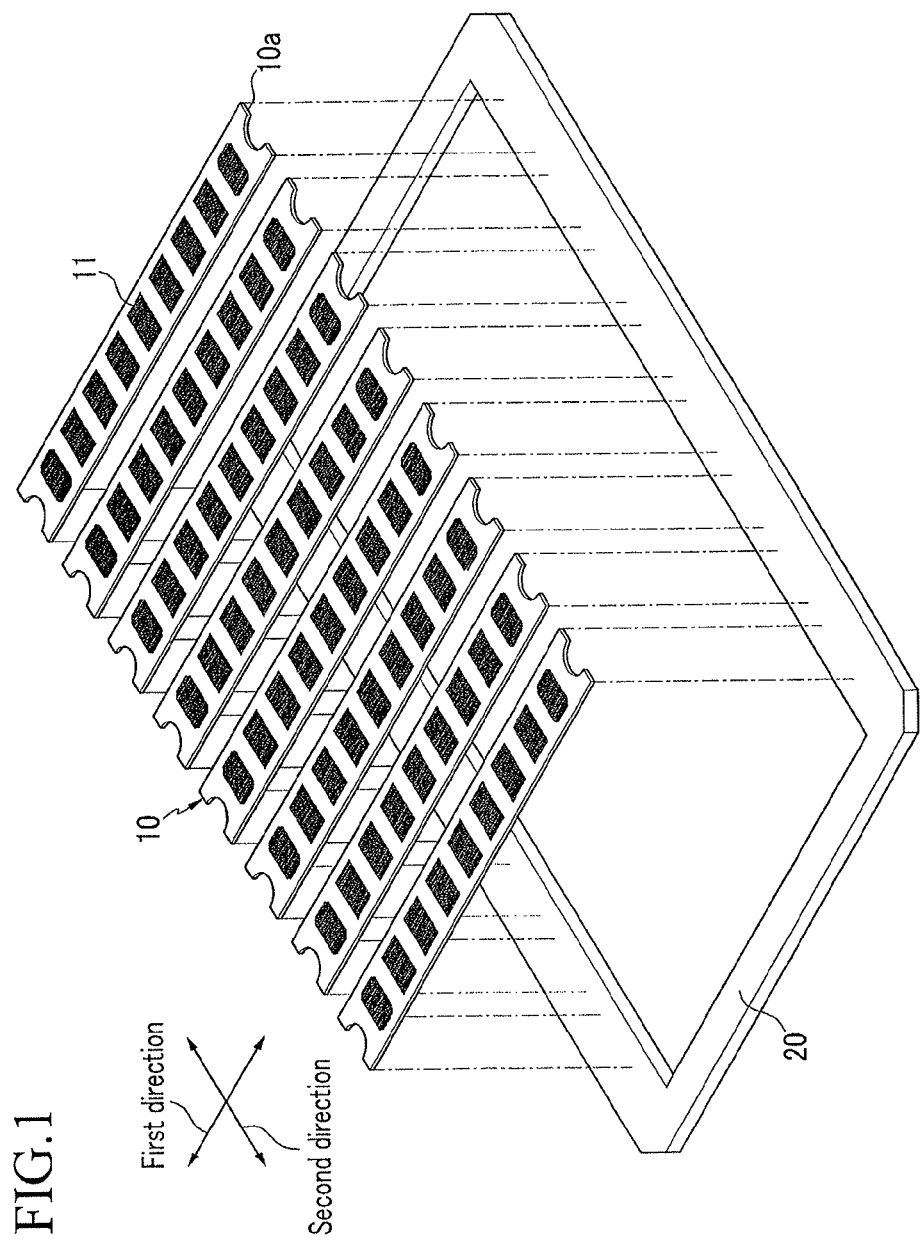
FIG. 1 is a perspective view of a mask assembly manufactured using a clamp according to an exemplary embodiment.

Embodiments will be described more fully hereinafter with reference to the accompanying drawings, in which exemplary embodiments of the invention are shown. The described embodiments may be modified in various different ways, all without departing from the spirit or scope of the present invention.

Accordingly, the drawings and description are to be regarded as illustrative in nature and not restrictive. Like reference numerals designate like elements throughout the specification.

In addition, a configuration having the same components denoted by the same reference numerals will representatively be in an one exemplary embodiment of various exemplary embodiments and other components different from the exemplary embodiment will be described in succeeding exemplary embodiments.

In addition, the size and thickness of each component shown in the drawings are arbitrarily shown for understanding and ease of description.

In addition, unless explicitly described to the contrary, the word "comprise" and variations such as "comprises" or "comprising", will be understood to imply the inclusion of stated elements but not the exclusion of any other elements. Further, it will be understood that when an element such as a layer, film, region, or substrate is referred to as being "on" another element, it can be directly on the other element or intervening elements may also be present.

Hereinafter, a clamp according to an exemplary embodiment will be described with reference to FIG. 1 to FIG. 4.

FIG. 1 is a perspective view of a mask assembly manufactured using a clamp according to the exemplary embodiment.

As shown in FIG. 1, the mask assembly manufactured using the clamp according to the exemplary embodiment includes a plurality of unit masks 10 and a frame 20.

Figure 2:
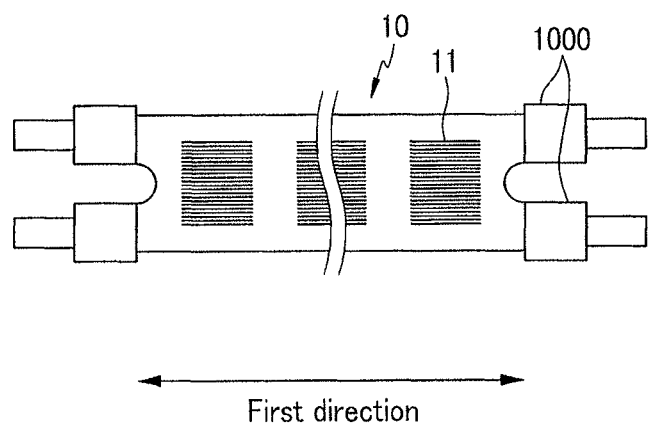
FIG. 2 shows a unit mask applied with a tension using the clamp according to an exemplary embodiment.

FIG. 2 shows unit mask applied with a tension using the clamp according to the exemplary embodiment.

As shown in FIG. 1 and FIG. 2, each unit mask 10 is formed in the shape of a band extended to a first direction, that is, a length direction, and both ends 10a of the unit mask 10 are supported by a frame 20 while in a state that a tensile force is applied to the unit mask 10 to the first direction using a clamp 1000 according to the exemplary embodiment. The unit mask 10 is provided in plural, and the plurality of unit masks 10 are arranged neighboring each other along a second direction that a width direction crossing the first direction. Both ends 10a of the unit mask 10 may be formed in the shape of a horseshoe of which a center area is concaved, but other shapes are possible. Both ends 10a of the unit mask 10 may be formed flat.

Each unit mask 10 includes patterns 11.

The patterns 11 are arranged along the first direction in each unit mask 10. The pattern unit 11 may correspond to a single organic light emitting diode (OLED) display, and in this case, patterns forming several OLED displays may be simultaneously formed in a mother substrate where the OLED display is to be manufactured through a single process using the unit masks 10. The pattern unit 11 is disposed in the unit mask 10 corresponding to a deposition area of patterns that form the OLED display. The pattern unit 11 has an open pattern penetrating the unit mask 10 for the patterns forming the OLED display to be formed in the mother substrate through the pattern unit 11. The pattern unit 11 includes a plurality of stripe-type slits.

The frame 20 fixes and supports both ends 10a of each of the plurality of unit masks 10 to which a tensile force is applied in the first direction. The unit mask 10 fixed to the frame 20 is supported by the frame 20 while in a state of being applied with the tensile force in the first direction, and accordingly a compression force is generated along the first direction that is an extension direction of the unit mask 10. The frame 20 may be formed of a metallic material having strong strength such as stainless steel to prevent deformation due to the compression force of the unit mask 10.

Figure 3:
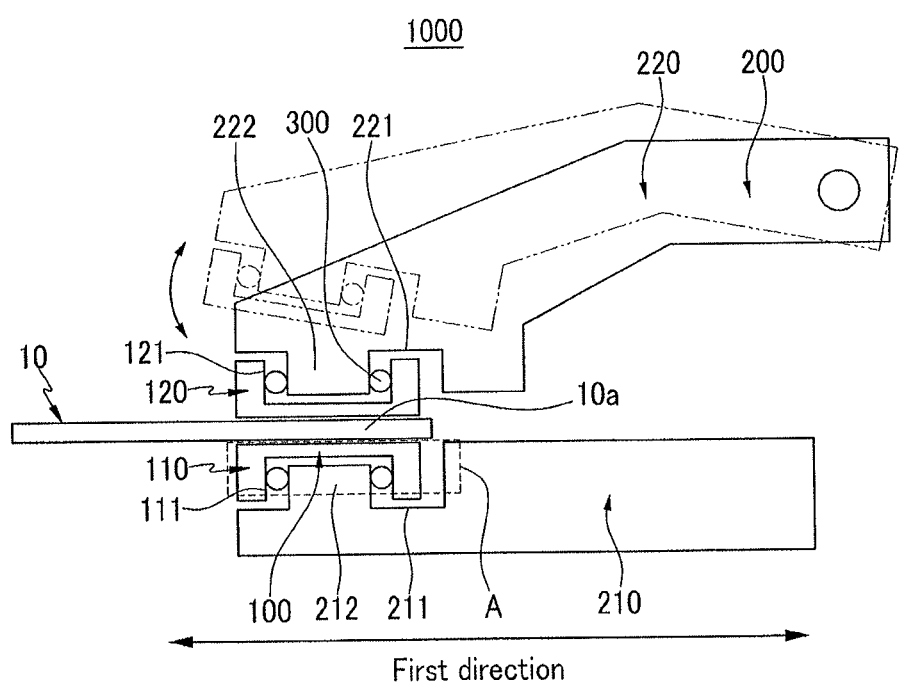
FIG. 3 is a cross-sectional view of the clamp according to the exemplary embodiment illustrated in FIG. 2.

FIG. 3 is a cross-sectional view of the clamp according to the exemplary embodiment.

As shown in FIG. 3, a clamp 1000 according to the exemplary embodiment pulls the unit mask 10 to the first direction by clamping the end 10a of the unit mask 10. The clamp 1000 clamps the end 10a of the unit mask 10 supported while in the state that the tensile force is applied to the frame 20.

The clamp 1000 includes a rotation contact portion 100, a clamp main body 200, and bearings 300.

The rotation contact portion 100 is rotatably supported by the clamp main body 200, and directly contacts the end 10a of the unit mask 10 by the clamp main body 200 to directly press the end 10a of the unit mask 10. The rotation contact portion 100 includes a first sub-rotation contact portion 110 and the second sub-rotation contact portion 120.

The first sub-rotation contact portion 110 contacts the bottom surface of the end 10a of the unit mask 10, and includes a concaved first portion 111 formed corresponding to the clamp main body 200.

The second sub-rotation contact portion 120 contacts the front surface of the end 10a of the unit mask 10, and includes a concaved second portion 121 formed corresponding to the clamp main body 200.

The clamp main body 200 presses the end 10a of the unit mask 10 by clamping the end 10a of the unit mask 10. The clamp main body 200 includes a pair of first tongs 210 and a pair of second tongs 220.

The first tongs 210 are disposed in the bottom side of the end 10a of the unit mask 10. The first tongs 210 include a first groove 211 and a first rotating shaft 212.

The first groove 211 is concaved from the surface of the first tongs 210 corresponding to the end 10a of the unit mask 10, and the first sub-rotation contact portion 110 is disposed in the first groove 211.

The first rotation shaft 212 is protruded toward the first sub-rotation contact portion 110 from the first groove 211, and is inserted to the concaved first portion 111 formed in the first sub-rotation contact portion 110.

The second tongs 220 are disposed in the front side of the end 10a of the unit mask 10 so as to be rotatable to a direction of the first tongs 210. The second tongs 220 include a second groove 221 and a second rotation shaft 222.

The second groove 221 is concaved from the surface of the second tongs 220 corresponding to the end 10a of the unit mask 10. The second sub-rotation contact portion 120 is disposed in the second groove 221.

The second rotation shaft 222 is protruded toward the second sub-rotation contact portion 120 from the second groove 221, and is inserted to the concaved second portion 121 formed in the second sub-rotation contact portion 120.

The bearings 300 are disposed between the concaved first portion 111 and the first rotation shaft 212 and between the concaved second portion 121 and the second rotation shaft 222, and the first sub-rotation contact portion 110 and the second sub-rotation contact portion 120 by the first tongs 210 and the second tongs 220 in a manner that the first sub-rotation contact portion 110 and the second sub-rotation contact portion 120 to be rotatable.

In the clamp 1000 according to this exemplary embodiment, the concaved first portion 111 and the concaved second portion 121 are formed in the rotation contact portion 100 and the first rotation shaft 212 and the second rotation shaft 222 are formed in the clamp main body 200. However, in other implementations, a concaved first portion and a concaved second portion may be formed in a clamp main body and a first rotation shaft and a second rotation shaft may be formed in a rotation contact portion.

Figure 4:
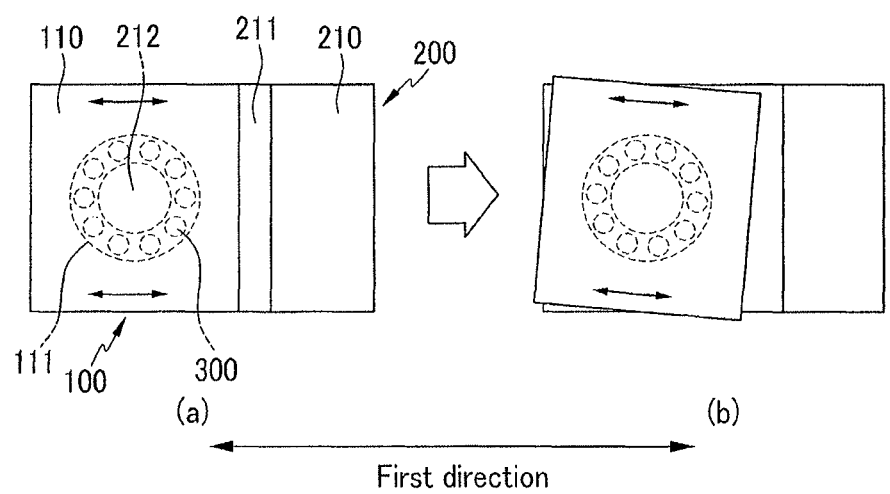
FIG. 4 is a top plan view of "A" in FIG. 3.

FIG. 4 is a top plan view of "A" in FIG. 3.

As shown in FIG. 3 and (a) of FIG. 4, when the clamp 1000 is pulled to the first direction while rotation contact portion 100 is in contact with the end 10a of the unit mask 10, waves may be generated in a length or width direction of the unit mask 10 due to a tensile force applied along the length direction (i.e., the first direction) of the unit mask 10. In this case, as shown in (b) of FIG. 4, when the direction of the tension applied to the unit mask 10 is changed to smooth the waves generated in the unit mask 10, the tension direction directly applied to the unit mask 10 by the clamp main body 200 is not changed but the tension direction indirectly applied to the unit mask 10 by the rotation contact portion 100 that is in direct contact with the unit mask 10 rotatably supported by the clamp main body 200 is changed. Thus, a tension difference applied to the entire unit mask 10 is minimized so that generation of waves in the length or width direction of the unit mask 10 due to the tensile force by the clamp 1000 may be suppressed.

In the clamp 1000 according to this exemplary embodiment, the rotation contact portion 100 rotatably supported by the clamp main body 200 directly contacts the end 10a of the unit mask 10. Therefore, although the direction of the tension applied to the unit mask 10 is changed to smooth the waves generated in the unit mask 10, a tensile difference applied to the entire unit mask 10 is minimized so that generation of waves in the length or width direction of the unit mask 10 due to the tensile force by the clamp 1000 may be suppressed.

Hereinafter, a clamp according to a another exemplary embodiment will be described with reference to FIG. 5 and FIG. 6.

Hereinafter, specific portions that are different from those of the previous exemplary embodiment are described.

In addition, in this exemplary embodiment, for better comprehension and ease of description, the same constituent elements are designated by the same reference numerals as the previous exemplary embodiment.

Figure 5:
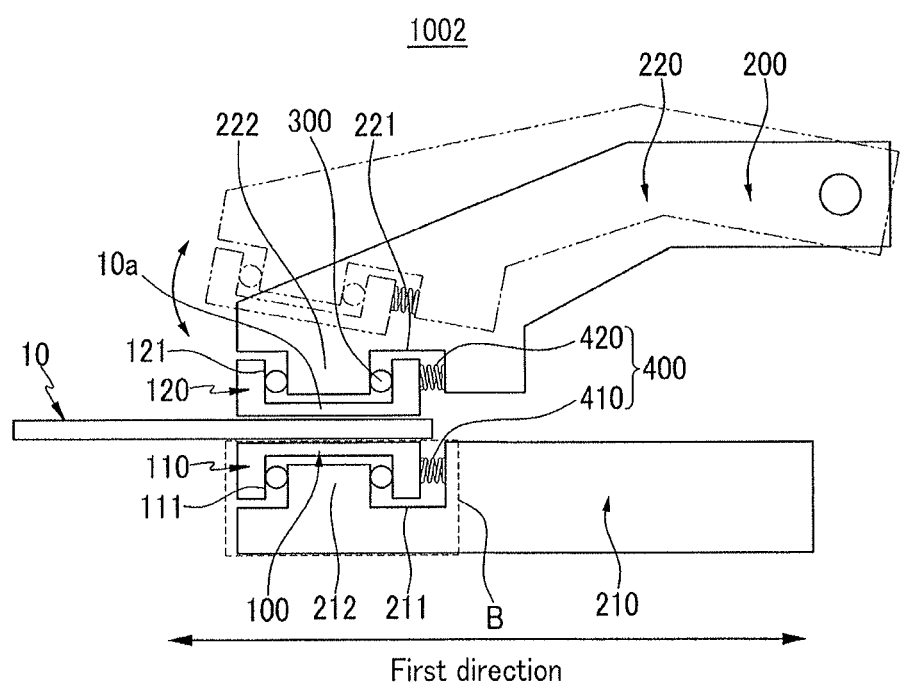
FIG. 5 is a cross-sectional view of a clamp according to another exemplary embodiment.

FIG. 5 is a cross-sectional view of the clamp according to this exemplary embodiment.

As shown in FIG. 5, a clamp 1002 according to this exemplary embodiment includes a rotation contact portion 100, a clamp main body 200, bearings 300, and a restoring spring 400.

The restoring spring 400 connects the rotation contact portion 100 and the clamp main body 200 such that an elastic restoring force is generated between the rotation contact portion 100 and the clamp main body 200.

The restoring spring 400 includes a first sub-restoring spring 410 and a second sub-restoring spring 420.

The first sub-restoring spring 410 is provided in a first groove 211, and connects the first sub-rotation contact portion 110 and a pair of first tongs 210. The first sub-restoring spring 410 restores the first sub-rotation contact portion 110 to its initial position when the elastic restoring force is generated between the first sub-rotation contact portion 110 and the first tongs 210 and thus the first tongs 210 are separated from the unit mask 10. When the first sub-rotation contact portion 110 is separated from the unit mask 10, the first sub-restoring spring 410 suppresses interference of the first sub-rotation contact portion 110 when another unit mask is clamped after the first sub-rotation contact portion 110 is restored to the original position.

Figure 6:
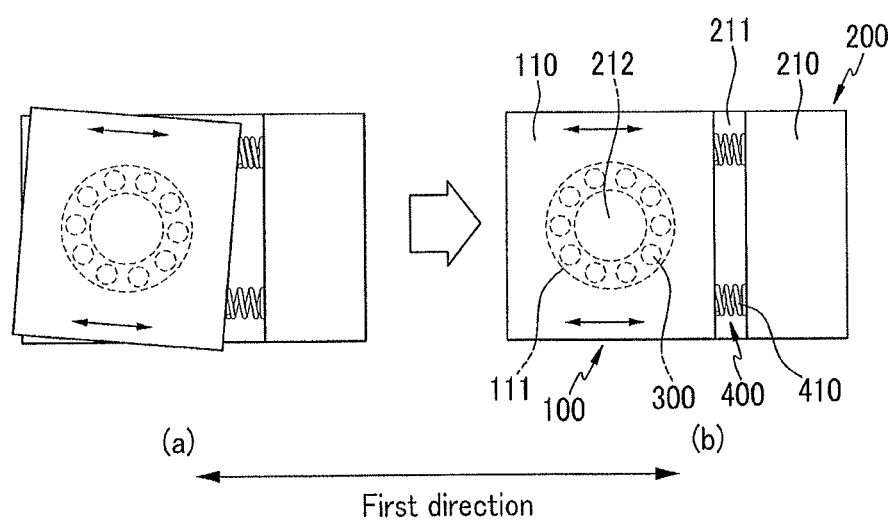
FIG. 6 is a top plan view of "B" in FIG. 5.

FIG. 6 is a top plan view of "B" in FIG. 5.

In further detail, as shown in (a) of FIG. 6, when the first sub-rotation contact portion 110 is separated from the unit mask 10 while the first sub-rotation contact portion 110 is rotated with respected the first tongs 210, an elastic restoring force is generated by the first sub-restoring spring 410 as shown in (b) of FIG. 6 so that the first sub-rotation contact portion 110 is restored to its original position.

A second sub-restoring spring 420 is provided in the second groove 221, and connects the second sub-rotation contact portion 120 and a pair of second tongs 220. The second sub-restoring spring 420 generates the elastic restoring force between the second sub-rotation contact portion 120 and the second tongs 220 so that the second sub-rotation contact portion 120 can be restored to its original position when the second tongs 220 are separated from the unit mask 10. When the second sub-rotation contact portion 120 is separated from the unit mask 10, the second sub-restoring spring 420 restores the second sub-rotation contact portion 120 to its original position to suppress interference of the second sub-rotation contact portion 120 when another unit claim is clamped.

As described, in the clamp 1002 according to this exemplary embodiment, the rotation contact portion 100 is restored to its original position when the rotation contact portion 100 rotatably supported by the clamp main body 200 is separated from an end 10a of the unit mask 10 so that interference of the rotation contact portion 100 can be suppressed, thereby improving reliability of clamping process by the clamp 1002.

Hereinafter, a clamp according to another exemplary embodiment will be described with reference to FIG. 7.

Hereinafter, specific portions that are different from those of the previous exemplary embodiments are described. In addition, in the this exemplary embodiment, for better comprehension and ease of description, the same constituent elements are designated by the same reference numerals as the previous embodiments.

Figure 7:
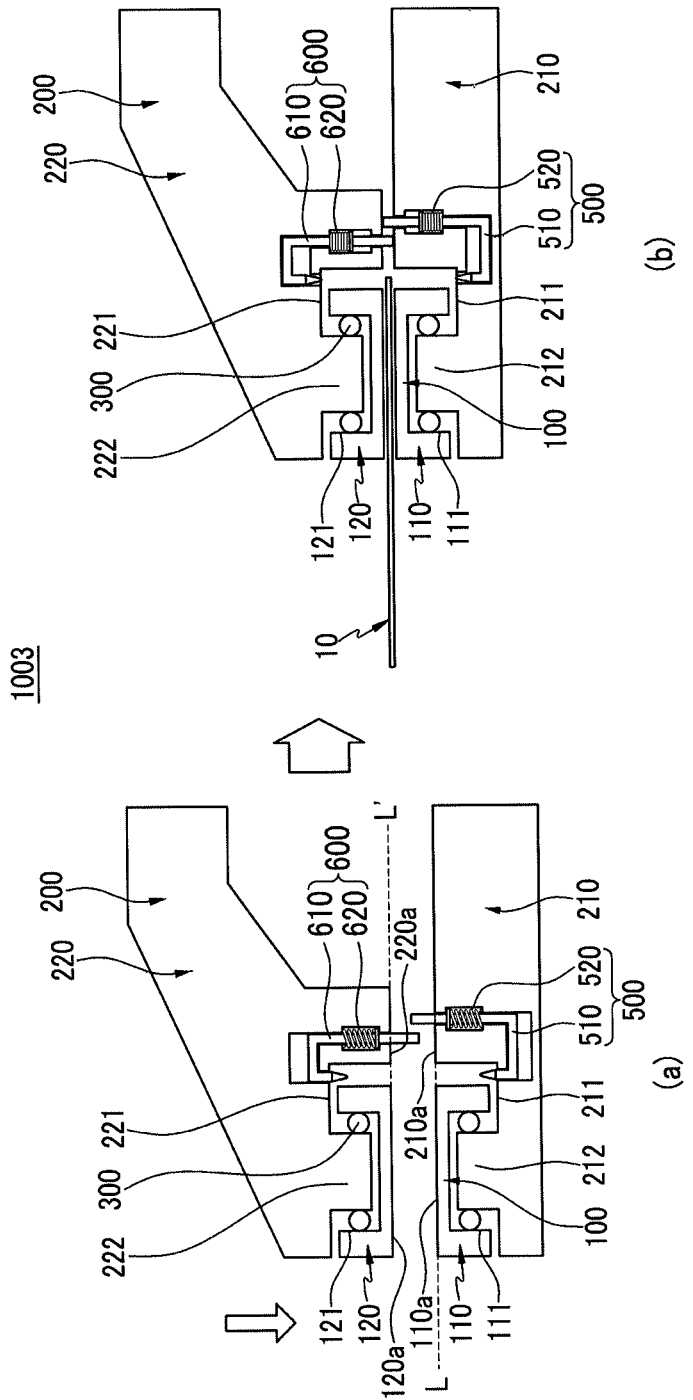
FIG. 7 is a cross-sectional view of a clamp according to another exemplary embodiment.

FIG. 7 is a cross-sectional view of the clamp according to this exemplary embodiment.

As shown in (a) of FIG. 7, a clamp 1003 according to this exemplary embodiment includes a rotation contact portion 100, a clamp main body 200, bearings 300, a first stopper 500, a second stopper 600.

The first stopper 500 is disposed between a first sub-rotation contact portion 110 and a pair of first tongs 210 to limit rotation of first sub-rotation contact portion 110, and when the first sub-rotation contact portion 110 contacts an end 10a of the unit mask 10, the first stopper 500 moves into the first tongs 210 from between the first sub-rotation contact portion 110 and the first tongs 210.

The first stopper 500 includes a first stopper main body 510 and a first spring 520.

The first stopper main body 510 is extended in a bent manner into the first tongs 210 from between the first sub-rotation contact portion 110 that is the inside of the first groove 211 and the first tongs 210 and then penetrates a first protruded side 210a of the first tongs 210. The first protruded side 210a of the first tongs 210 is disposed on an imaginary line L that aligns with a first contact side 110a of the first sub-rotation contact portion 110 that contacts the end 10a of the unit mask 10.

The first spring 520 is disposed in the first tongs 210, and an elastic restoring force is generated between the first stopper main body 510 and the first tongs 210.

The second stopper 600 is provided between a second sub-rotation contact portion 120 and a pair of second tongs 220 to limit rotation of the second sub-rotation contact portion 120. When the second sub-rotation contact portion 120 contacts an end 10a of the unit mask 10, the second stopper 600 moves into the second tongs 220 from between the second sub-rotation contact portion 120 and the second tongs 220.

The second stopper 600 includes a second stopper main body 610 and a second spring 620.

The second stopper main body 610 is extended in a bent manner into the second tongs from between the second sub-rotation contact portion 120 that is the inside of the second groove 221 and the second tongs 220 and penetrates a second protruded side 220a of the second tongs 220. The second protruded side 220a of the second tongs 220 is disposed on an imaginary line L' that aligns with a second contact side 120a of the second sub-rotation contact portion 120 that contacts the end 10a of the unit mask 10.

The second spring 620 is provided in the second tongs 220, and generates an elastic restoring force between the second stopper main body 610 and the second tongs 220.

As shown in (b) of FIG. 7, in the clamp 1003 according to this exemplary embodiment, the first contact side 110a and the second contact side 120a of first sub-rotation contact portion 110 and the second sub-rotation contact portion 120 respectively contact the unit mask 10, the first stopper main body 510 and the second stopper main body 610 respectively penetrating the first contact side 110a and the second contact side 120a are respectively pressed by the second protruded side 220a and the first protruded side 210a. Accordingly, the first stopper 500 and the second stopper 600 respectively move into the first tongs 210 and the second tongs 220 from between the first sub-rotation contact portion 110 and the first tongs 210 and between the second sub-rotation contact portion 120 and the second tongs 220.

When the first sub-rotation contact portion 110 and the second sub-rotation contact portion 120 are respectively separated from the unit mask 10, the first spring 520 and the second spring 620 are respectively moved between the first sub-rotation contact portion 110 and the first tongs 210 and between the second sub-rotation contact portion 120 and the second tongs 220 by the elastic restoring force of each of the first and second springs 520 and 620 to prevent rotation of the first sub-rotation contact portion 110 and the second sub-rotation contact portion 120.

As described, in the clamp 1003 according to this exemplary embodiment, rotation of the rotation contact portion 100 rotatably supported by the clamp main body 200 may be suppressed by the first and second stoppers 500 and 600 while the rotation contact portion 100 is separated from the end 10a of the unit mask 10. Therefore, undesired rotation of the rotation contact portion 100 may be prevented unless the rotation contact portion 100 contacts the end 10a of the unit mask 10. Thereby, reliability of a clamping process by the clamp 1003 may be improved.

Hereinafter, a clamp according to another exemplary embodiment will be described with reference to FIG. 8.

Hereinafter, specific portions that are different from those of the previous exemplary embodiments are described. In addition, in this exemplary embodiment, for better comprehension and ease of description, the same constituent elements are designated by the same reference numerals as the previous embodiments.

Figure 8:
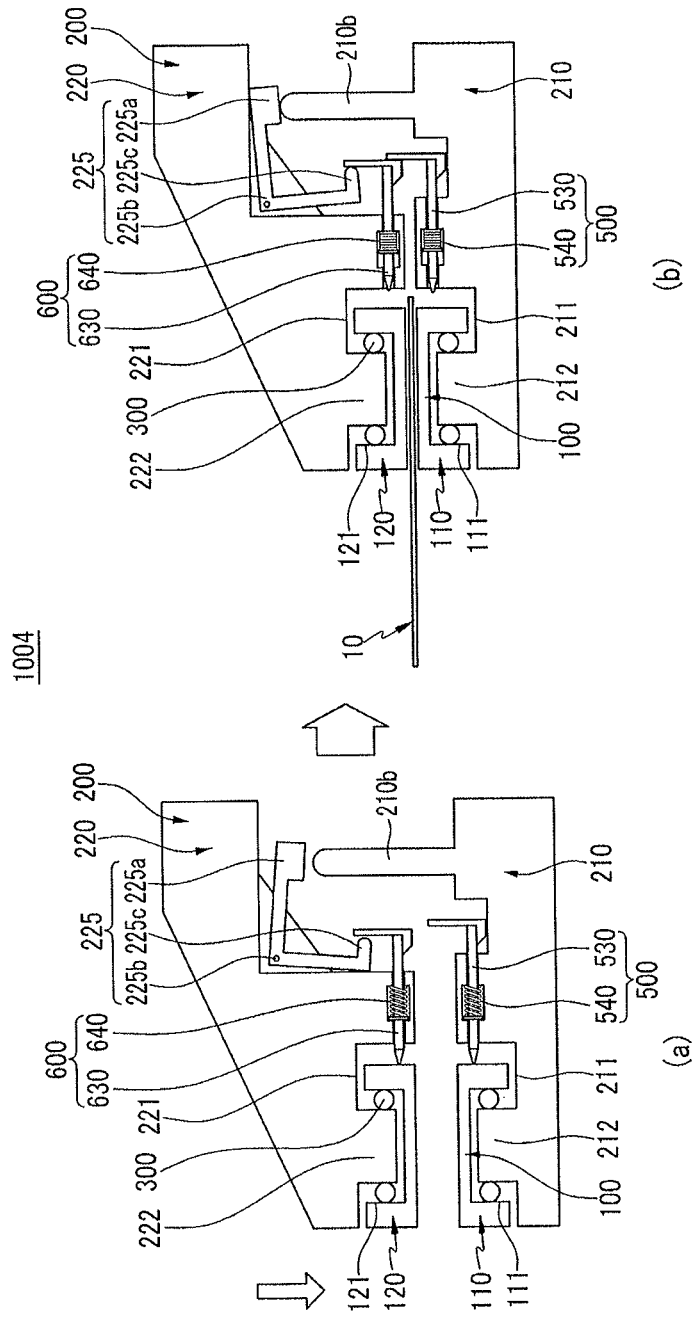
FIG. 8 is a cross-sectional view of a clamp according to another exemplary embodiment.

FIG. 8 is a cross-sectional view of a clamp according to this exemplary embodiment.

As shown in (a) of FIG. 8, a clamp 1004 according to this exemplary embodiment includes a rotation contact portion 100, a clamp main body 200, bearings 300, a first stopper 500, and a second stopper 600.

The first stopper 500 is disposed between the first sub-rotation contact portion 110 and a pair of first tongs 210 to limit rotation of a first sub-rotation contact portion 110. When the first sub-rotation contact portion 110 contacts an end 10a of the unit mask 10, the first stopper 500 moves into the first tongs 210 from between the first sub-rotation contact portion 110 and the first tongs 210.

The first stopper 500 includes a third stopper main body 530 and a third spring 540.

The third stopper main body 530 is extended into the first tongs 210 from between the first sub-rotation contact portion 110 that is the inside of a first groove 211 and the first tongs 210 and then protruded in a bent manner to the outside of the first tongs 210.

The third spring 540 is provided in the first tongs 210, and generates an elastic restoring force between the third stopper main body 530 and the first tongs 210.

The second stopper 600 is disposed between the second sub-rotation contact portion 120 and a pair of second tongs 220 to limit rotation of a second sub-rotation contact portion 120. When the second sub-rotation contact portion 120 contacts the end 10a of the unit mask 10, the second stopper 600 moves into the second tongs 220 from between the second sub-rotation contact portion 120 and the second tongs 220.

The second stopper 600 includes a fourth stopper main body 630 and a fourth spring 640.

The fourth stopper main body 630 is extended into the second tongs 220 from between the second sub-rotation contact portion 120 that is the inside of a second groove 221 and the second tongs 220 and protruded in a bent manner to the outside of the second tongs 220. The fourth stopper main body 630 is protruded to be overlapped with the third stopper main body 530.

The fourth spring 640 is disposed in the second tongs 220, and generates an elastic restoring force between the fourth stopper main body 630 and the second tongs 220.

The first tongs 210 further include a protrusion 210b protruded to a direction of the second tongs 220, and the second tongs 220 further include a weight 225a lifted by the protrusion 210b corresponding to the protrusion 210b, a lever shaft 225b extended from the weight 225a and supported by the second tongs 220, and a lever bar 225 having a hook 225c extended from the fourth stopper main body 630 from the lever shaft 225b.

As shown in (b) of FIG. 8, in the clamp 1004 according to this exemplary embodiment, when the first sub-rotation contact portion 110 and the second sub-rotation contact portion 120 respectively contact the unit mask 10, the protrusion 210b lifts the weight 225a and the lever bar 225 rotates according to the lift of the weight 225a with respect to the lever shaft 225b so that the hook 225a moves the fourth stopper main body 630 to a direction of the protruding portion 210b. The third stopper main body 530 overlapped with the fourth stopper main body 630 is also moved to the direction of the protrusion 210b while the fourth stopper main body 630 moves to the direction of the protruding portion 210b. Accordingly, the first stopper 500 and the second stopper 600 respectively move into the first tongs 210 and the second tongs 220 from between the first sub-rotation contact portion 110 and the first tongs 210 and between the second sub-rotation contact portion 120 and the second tongs 220.

When the first sub-rotation contact portion 110 and the second sub-rotation contact portion 120 are respectively separated from the unit mask 10, the protrusion 210b is separated from the weigh 225a and thus dropped due to the weight of the weight 225b, and the lever bar 225 rotates with respect to the level shaft 225 due to the drop of the weight 225a so that the hook 225c moves to a direction of the second tongs 220. In this case, the first stopper 500 and the second stopper 600 respectively move back between the first sub-rotation contact portion 110 and the first tongs 210 and between the second sub-rotation contact portion 120 and the second tongs 220 by the elastic restoring force to prevent rotation of the first sub-rotation contact portion 110 and the second sub-rotation contact portion 120.

As described, in the clamp 1004 according to this exemplary embodiment, the rotation of the rotation contact portion 100 is suppressed while the rotation contact portion 100 rotatably supported by the clamp main body 200 is separated from the end 10a of the unit mask 10. Therefore, undesired rotation of the rotation contact portion 100 may be prevented unless the rotation contact portion 100 contacts the end 10a of the unit mask 10, thereby improving reliability of a clamping process by the clamp 1004.

By way of summation and review, organic materials forming an organic emission layer may be very vulnerable to moisture and oxygen, etc, such that they should be thoroughly isolated from moisture during a process of forming the organic emission layer and after forming the organic emission layer. Therefore, it may be difficult to perform patterning using a general photolithography process. Instead, the organic emission layer and the second electrode, etc. may be formed using a mask on which a pattern opening part for penetrating deposition materials only through a portion corresponding to each pattern is formed.

Recently, a mask assembly has been used including a frame including an opening part and a plurality of unit masks in a band shape, both ends of which are fixed to the frame, corresponding to the opening part. In such a mask assembly, a unit mask is supported by the frame while a tensile force is applied to the unit mask in a length direction. Thus, the unit mask is pulled using a clamp and then supported by the frame.

However, when the unit mask is pulled using a clamp, waves may undesirably occur in the unit mask along a width direction thereof due to a tensile force applied to the unit mask in the length direction by the clamp.

In contrast, embodiments may provide a clamp that may suppress the occurrence of waves in a width direction of a unit mask due to a tensile force applied to the unit mask in a length direction.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A unit mask clamp that clamps an end of a unit mask that is supported while a tensile force is applied to the unit mask, the clamp comprising:
    a clamp main body; and
    a rotation contact portion rotatably supported by the clamp main body and directly contacting the end of the unit mask,
        the rotation contact portion including a concaved portion and the clamp main body including a non-rotatable shaft inserted to the concaved portion, the rotation contact portion rotating about the non-rotatable shaft.

2. The clamp of claim 1, wherein the clamp main body is directly connected to the non-rotatable shaft inserted to the concaved portion.

3. The clamp of claim 1, further comprising bearings provided between the concaved portion and the non-rotatable shaft and surrounding the non-rotatable shaft.

4. The clamp of claim 1, wherein an elastic restoring force is generated between the rotation contact portion and the clamp main body.

5. The clamp of claim 4, further comprising a restoring spring directly connecting the rotation contact portion and the clamp main body and generating the elastic restoring force.

6. The clamp of claim 1, further comprising a stopper that is provided between the rotation contact portion and the clamp main body and that limits rotation of the rotation contact portion, the stopper being movable into the clamp main body from between the rotation contact portion and the clamp main body when the rotation contact portion contacts the end of the unit mask.

7. The clamp of claim 1, wherein:
    the rotation contact portion includes:
        a first sub-rotation contact portion contacting a bottom side of the end of the unit mask and
        a second sub-rotation contact portion contacting a front side of the end of the unit mask, and
    the clamp main body includes,
        first tongs disposed on the bottom side of the end of the unit mask, the first tongs including a concaved first groove where the first sub-rotation contact portion is located, the first tongs being directly connected to the non-rotatable shaft, and
    second tongs disposed on the front side of the end of the unit mask so as to be rotatable to a direction of the first tongs, the second tongs including a concaved second groove where the second sub-rotation contact portion is located, the second tongs being directly connected to the non-rotatable shaft.

8. The clamp of claim 7, further comprising:
    a first stopper disposed between the first sub-rotation contact portion and the first tongs to limit rotation of the first sub-rotation contact portion, the first stopper being movable into the first tongs from between the first sub-rotation contact portion and the first tongs when the first sub-rotation contact portion contacts the end of the unit mask; and
    a second stopper disposed between the second sub-rotation contact portion and the second tongs to limit rotation of the second sub-rotation contact portion, the second stopper being movable into the second tongs from between the second sub-rotation contact portion and the second tongs when the second sub-rotation contact contacts the end of the unit mask.

9. The clamp of claim 8, wherein:
    the first tongs further include a first protruded side disposed on an imaginary line that aligns with a first contact side of the first sub-rotation contact portion that is in contact with the end of the unit mask,
    the second tongs further includes a second protruded side disposed on an imaginary line that aligns with a second contact side of the second sub-rotation contact portion that is in contact with the end of the unit mask,
    the first stopper includes:

a first stopper main body extended in a bent manner into the first tongs from between the first sub-rotation contact portion and the first tongs, the first stopper main body penetrating the first protruded side, and a first spring located in the first tongs and generating an elastic restoring force between the first stopper main body and the first tongs, and the second stopper includes:

a second stopper main body extended in a bent manner into the second tongs from between the second sub-rotation contact portion and the second tongs and penetrating the second protruded side, and a second spring disposed in the second tongs and generating an elastic restoring force between the second stopper main body and the second tongs.

10. The clamp of claim 8, wherein:

the first stopper includes:

a third main body extended into the first tongs from between the first sub-rotation contact portion and the first tongs and then protruded in a bent manner to the outside of the first tongs, and a third spring disposed in the first tongs and generating an elastic restoring force between the third stopper main body and the first tongs, the second stopper includes:

a fourth stopper main body extended into the second tongs from between the second sub-rotation contact portion and the second tongs and then protruded in a bent manner to the outside of the second tongs, and being overlapped with the third stopper main body, and a fourth spring disposed in the second tongs and generating an elastic restoring force between the fourth stopper main body and the second tongs, the first tongs further include a protrusion protruded in a direction of the second tongs, and the second tongs further include a weight being liftable by the protrusion, a lever shaft extended from the weight and supported by the second tongs, and a lever bar including a hook extended to the fourth stopper from the lever shaft.

\* \* \* \* \*